United States Patent [19]

Ogawa et al.

[11] Patent Number: 5,130,704
[45] Date of Patent: Jul. 14, 1992

[54] LOGIC OPERATION CIRCUIT

[75] Inventors: Hiroaki Ogawa, Nagoya; Eisaku Itoh, Kasugai, both of Japan

[73] Assignees: Fujitsu Limited, Kawasaki; Fujitsu Vlsi Limited, Kasugai, both of Japan

[21] Appl. No.: 733,077

[22] Filed: Jul. 18, 1991

Related U.S. Application Data

[63] Continuation of Ser. No. 265,026, Oct. 31, 1988, abandoned.

[30] Foreign Application Priority Data

Oct. 30, 1987 [JP] Japan ................ 62-274980

[51] Int. Cl.$^5$ .............................................. G09G 5/00
[52] U.S. Cl. ............................... 340/803; 340/804; 364/DIG. 1; 364/DIG. 2; 364/716; 307/448; 307/445
[58] Field of Search ............ 340/721, 724, 703, 798, 340/799, 789, 803, 804, 801; 364/716, 200 MS File, 259 MS, 259.9 MS, 900 MS File, 947, 947.1, 259 .2 MS, 259.4 MS, 259.7 MS, 259.8 MS, 259.6 MS, 947.2 MS, 947.4 MS, 947.7 MS; 395/DIG. 1, DIG. 2

[56] References Cited

U.S. PATENT DOCUMENTS

| | | | |
|---|---|---|---|
| 3,201,574 | 8/1965 | Szekely . | |
| 3,846,745 | 11/1974 | Hill et al. | 307/243 |
| 4,721,868 | 1/1988 | Cornell et al. | 364/716 |
| 4,763,020 | 8/1988 | Takata et al. | 364/716 |
| 4,816,817 | 3/1989 | Herrington | 340/803 |
| 4,851,834 | 7/1989 | Stockebrand et al. | 340/799 |

OTHER PUBLICATIONS

"Fundamentals of Logic Design" by Roth, Jr., West Publishing Company, 1979, pp. 184 to 190, and 549 to 558.

IBM Technical Disclosure Bulletin, vol. 21, No. 6, Nov. 1978, pp. 2474-2475, New York, US; F. E. Sakalay: "Programmable Boolean Function Generator".

IEEE 1983-International Symposium on Circuits and Systems, Newport Beach, Calif., May 2-4, 1983, vol. 2, pp. 509-512, IEEE, New York, US; Y. Tsai: "Pass Transistor Networks in MOS Technology".

IEEE International Solid-State Circuits Conference, vol. 28, 32nd Conference, Feb. 13, 1985, pp. 86-87, 315, IEEE, New York, US; M. Kameyama et al.: "An NMOS Pipelined Image Processor Using Quaternary Logic".

Int. J. Electronics, vol. 40, No. 5, May 1976, pp. 509-512 S. Murugesan: "Programmable Universal Logic Module".

Analog Switch Data Book, Siliconix Inc., 1976, Santa Clara, Calif., pp. 1-125.

Primary Examiner—Jeffery A. Brier
Attorney, Agent, or Firm—Staas & Halsey

[57] ABSTRACT

A logic operation circuit includes an instruction signal generating circuit for generating an instruction signal which designates a bit of a predetermined n-bit code signal in accordance with a combination of a first input logical numeral and a second input logical numeral. The logic operation circuit also includes a bit selecting circuit for selecting said bit designated by the instruction signal generated by the instruction signal generating circuit and for outputting the selected bit as an output logical numeral.

12 Claims, 6 Drawing Sheets

LOGIC OPERATION CIRCUIT

This application is a continuation of application Ser. No. 07/265,026, filed Oct. 31, 1988, now abandoned.

BACKGROUND OF THE INVENTION

The present invention generally relates to a logic operation circuit, and more particularly to a logic operation circuit, which is suitably built in a semiconductor memory for image processing.

Currently, a computer system such as a personal computer and a workstation has various functions for displaying graphic information, such as multiwindow display, popup menu, and scroll bar. However, an expansion and enrichment of graphic functions impose a heavy load on software and thereby reduce the operation speed. From this viewpoint, a hardware function called a raster operation or bit blt is employed.

A raster operation denotes a function in which a rectangular region formed in a display memory such as a frame buffer is designated for each individual bit, and information in the designated rectangular region is transferred to a destination region. In the raster operation, a logic operation such as an AND, OR and EOR operation is carried out with respect to bit information stored in the rectangular region and bit information stored in the destination region. Such a logic operation is employed for enabling cursor display and overlapping window operation.

The raster operation can be implemented by a hardware structure which includes a frame buffer and an operation circuit. The frame buffer is divided into a frame region and a window region. The frame region has a memory space corresponding to a screen of a display unit. The window region has a memory space used for arranging a plurality of windows without overlapping each other or for storing data for cursor display and icon display as necessary. Image data supplied from a host computer is transferred directly to the frame buffer and is then stored in a position in the frame region or window region. Source data S and destination data D are read out from the frame buffer, and are then supplied to a logic operation circuit. In accordance with an instruction supplied from the host computer, the logic operation circuit selects an operation circuit which performs a corresponding logic expression. The selected logic circuit performs the logic operation on the source data S and the destination data D. A result of the logic operation is written into a region in which the above destination data was stored. For example, in a case where the designated logic operation is an OR operation, a logic expression "S OR D→Q" is performed, and an operation result Q is written into the region in which the destination data D was stored.

However, the above logic operation circuit has disadvantages described below. Since the logic operation circuit is constituted by a wired logic circuit, the circuit is necessarily large in size. For this reason, it is difficult to provide the logic operation circuit on a memory chip. Further, the time it takes to perform a logic expression such as AND, OR and NOR, varies depending on the type of logic expression. This is because the signal transfer characteristic of one operation circuit of the logic operation circuit is not the same as that of another operation circuit. The above circumstance arises from the circuit structure of a logic circuit and the number of gates thereof.

SUMMARY OF THE INVENTION

Accordingly, a general object of the present invention is to provide a logic operation circuit in which the above disadvantages of the conventional logic operation circuit are eliminated.

A more specific object of the present invention is to provide a compact logic operation circuit, in which the time required to perform a logic operation can be kept constant irrespective of the type of logical expression.

The above objects of the present invention are achieved by a logic operation circuit which includes an instruction signal generating circuit for generating an instruction signal which designates a bit of a predetermined n-bit code signal in accordance with a combination of a first input logic numeral and a second input logic numeral. The logic operation circuit also includes a bit selecting circuit for selecting the bit as thus designated by the instruction signal, generated by the instruction signal generating circuit, and for outputting the selected bit as an output logic numeral.

Other objects, features and advantages of the present invention will become apparent from the following detailed description when read in conjunction with the accompanying drawings.

DETAILED DESCRIPTION

Figure 1:
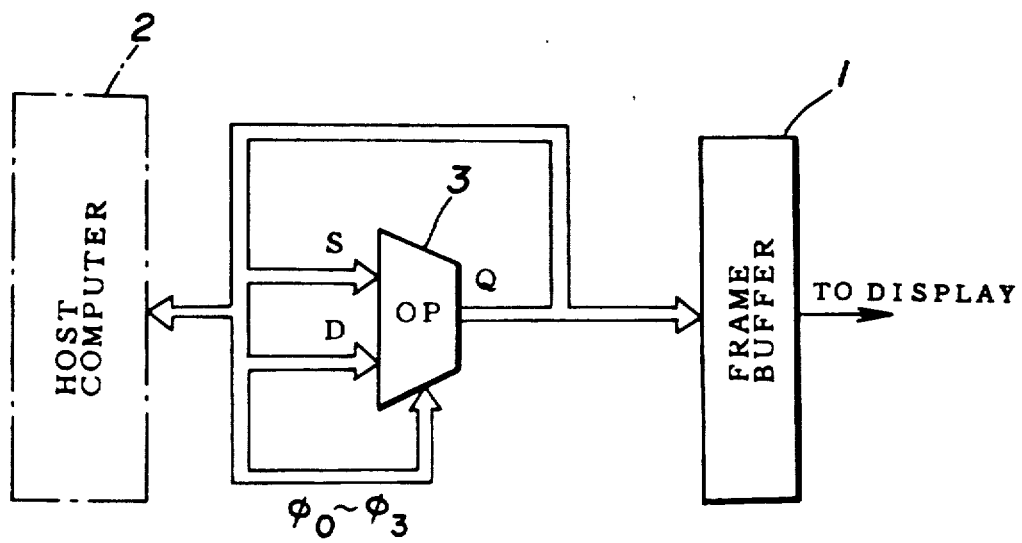
FIG. 1 is a block diagram of a conventional logic operation circuit which implements a raster operation.
Figure 2:
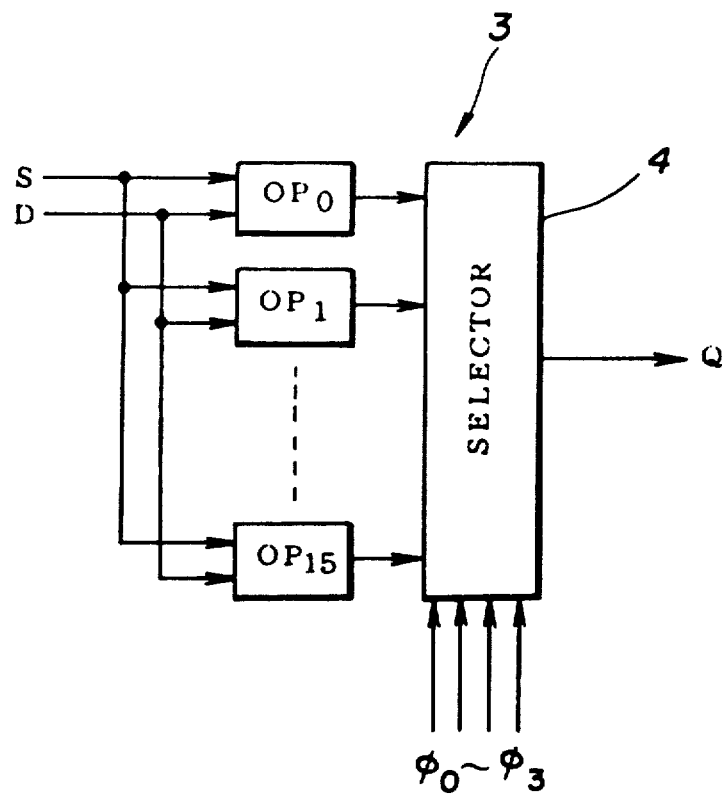
FIG. 2 is a block diagram of an operation circuit included in the logic operation circuit shown in FIG. 1.

To facilitate the understanding of the present invention, a description is now given of a conventional logic operation circuit with reference to FIGS. 1 and 2.

Referring to FIG. 1, a frame buffer 1 is divided into a frame region and a window region. The frame region has a memory space which corresponds to a screen on a display unit. The window region has a memory region used for arranging a plurality of windows without overlapping each other or for storing information for cursor display and icon display. Image data supplied from a host computer 2 is transferred directly to the frame buffer 1, and is then stored into a position in the frame region or window region. Source data S and destination data D are read out from the frame buffer 1, and are then supplied to a logic operation circuit 3. The logic operation circuit 3 selects a logic circuit which implements a logic expression designated by an instruction supplied from the host computer 2. The selected logic circuit performs the related logic operation with respect to the source data S and the destination data D. The result of the logic operation is written into a region in which the above destination data D was stored. For example, in a case where the designated logic operation is an OR operation (logical sum), a logic expression "S OR D→Q" is performed, and the operation result Q is written into the region in which the destination data D was stored.

FIG. 2 shows a structure of the logic operation circuit 3 shown in FIG. 1. The logic operation circuit 3 comprises 16 operation circuits OP0–OP15 associated with 16 different logical expressions. Each of the operation circuits OP0–OP15 is supplied with source data S and destination data D per bit. Output signals of the operation circuits OP0–OP15 are supplied to a selector 4. The selector 4 selects one operation circuit from among the operation circuits OP0–OP15 in accordance with a combination of operation codes $\phi_0$–$\phi_3$ supplied from the host computer 2. The result Q of the operation is supplied to the frame buffer 1.

TABLE 1 shows a relationship between the logical expressions implemented by the operation circuits OP0–OP15 and the operation codes $\phi_0$–$\phi_3$.

TABLE 1

| Circuits | Operation Codes | | | | Expressions |
|---|---|---|---|---|---|
| | $\phi_3$ | $\phi_2$ | $\phi_1$ | $\phi_0$ | |
| OP0 | 0 | 0 | 0 | 0 | "0" |
| OP1 | 0 | 0 | 0 | 1 | $\overline{D} \cdot S$ |
| OP2 | 0 | 0 | 1 | 0 | $D \cdot \overline{S}$ |
| OP3 | 0 | 0 | 1 | 1 | $S$ |
| OP4 | 0 | 1 | 0 | 0 | $D \cdot \overline{S}$ |
| OP5 | 0 | 1 | 0 | 1 | $D$ |
| OP6 | 0 | 1 | 1 | 0 | $D \oplus S$ |
| OP7 | 0 | 1 | 1 | 1 | $D + S$ |
| OP8 | 1 | 0 | 0 | 0 | $\overline{D \cdot S}$ |
| OP9 | 1 | 0 | 0 | 1 | $\overline{D \oplus S}$ |
| OP10 | 1 | 0 | 1 | 0 | $\overline{D}$ |
| OP11 | 1 | 0 | 1 | 1 | $\overline{D} + S$ |
| OP12 | 1 | 1 | 0 | 0 | $\overline{S}$ |
| OP13 | 1 | 1 | 0 | 1 | $D + \overline{S}$ |
| OP14 | 1 | 1 | 1 | 0 | $\overline{D + S}$ |
| OP15 | 1 | 1 | 1 | 1 | "1" |

However, the above 16 different, logic expressions are implemented by using wired logic. That is, the operation circuits OP0–OP15 are constituted by wired logic circuits. Since wired logic circuits are large in size, it is difficult to provide the logic operation circuit on a memory chip. Further, the time it takes to perform an operation varies depending on the type of logic expression. This is because the signal transfer characteristic of one operation circuit is not the same as that of another operation circuit. This arises from the circuit structure of a logic circuit and the number of gates thereof.

The present invention intends to overcome the above disadvantages.

Figure 3:
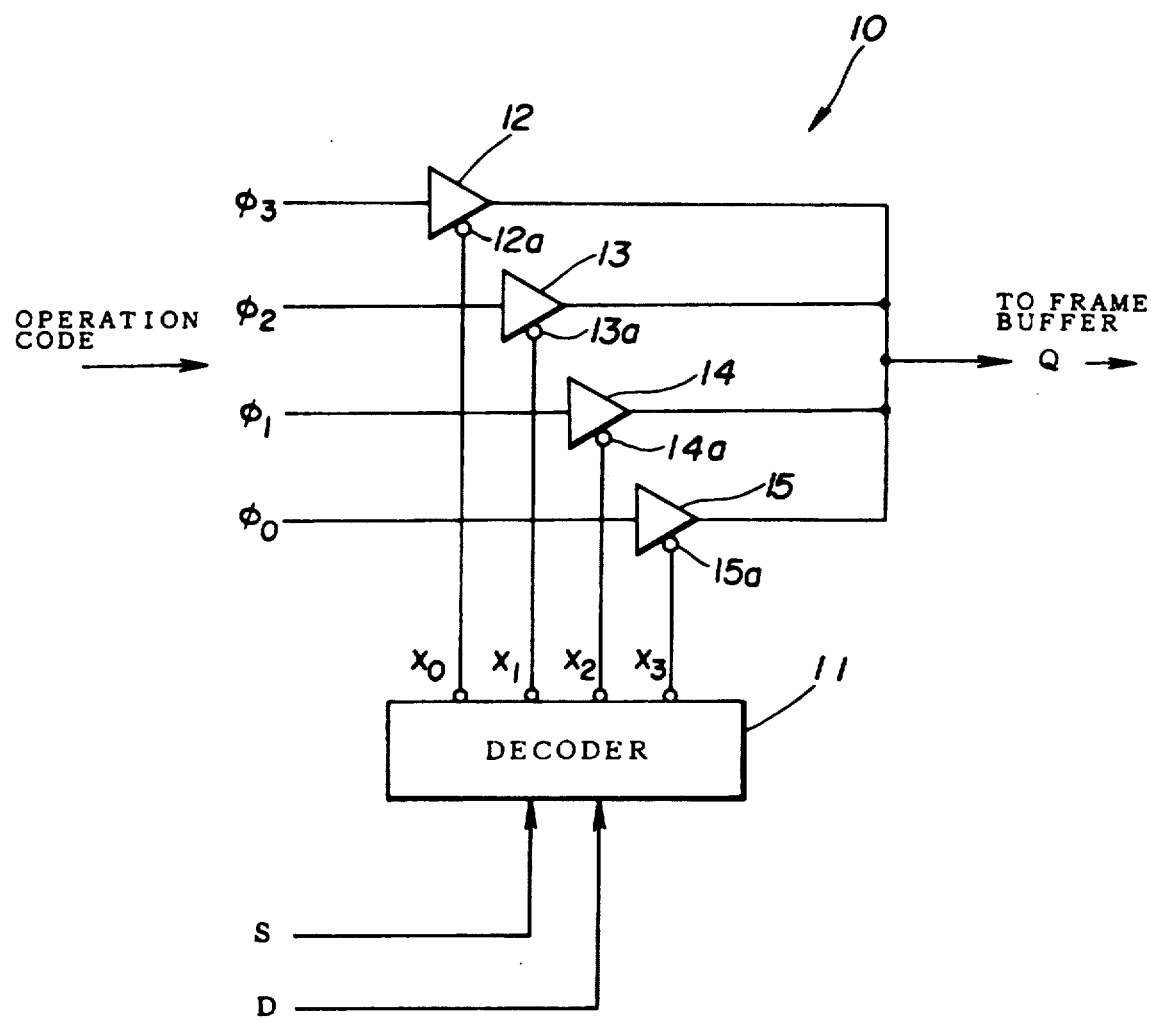
FIG. 3 is a block diagram of a preferred embodiment of the present invention.
Figure 4:
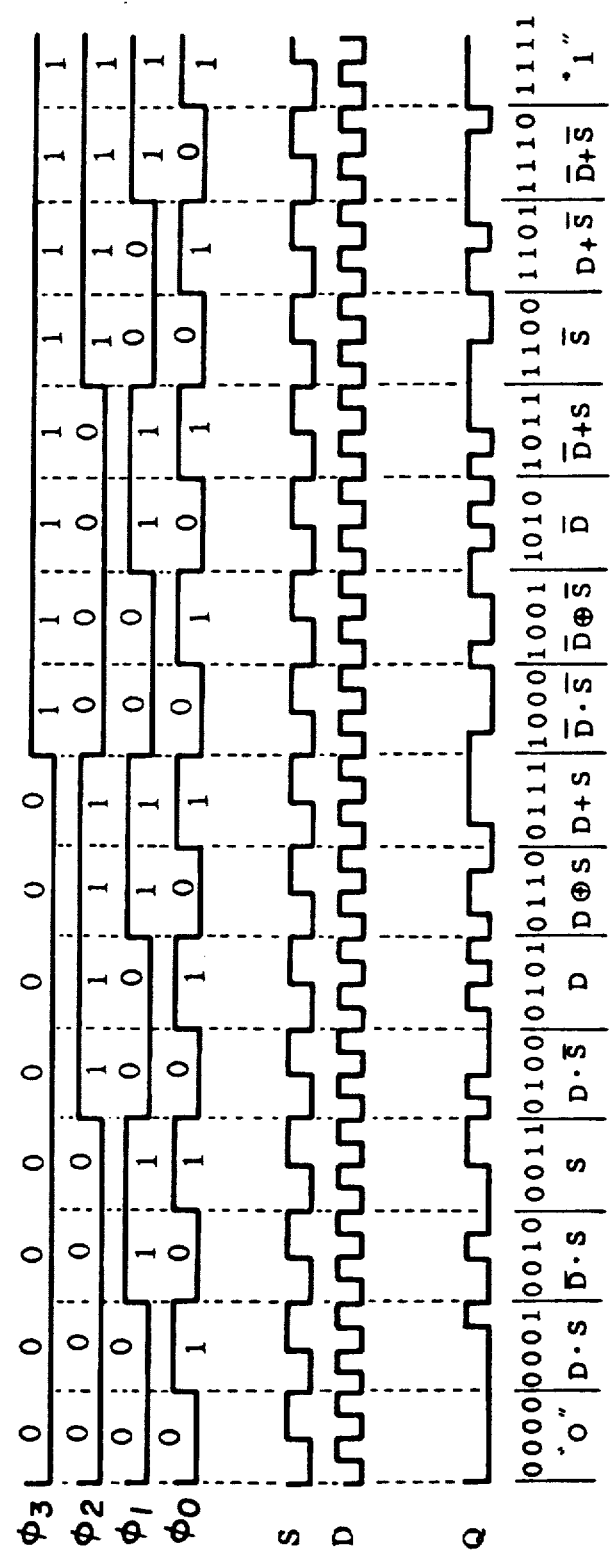
FIG. 4 is a timing chart of signals at different portions of the structure of FIG. 3.

A description is given of a preferred embodiment of the present invention with reference to FIGS. 3 and 4.

A logic operation circuit 10 is used in place of the logic operation circuit 3 shown in FIG. 1. The logic operation circuit 10 is connected to the host computer 2 and the frame buffer 1 as shown in FIG. 1. The logic operation circuit 10 comprises a decoder 11 and four transfer gates 12–15. The decoder 11 selects any one of its output terminals X0–X3 on the basis of a logic numeral X (source data S) and a logic numeral Y (destination data D). Then the decoder 11 sets the selected output terminal to a low level. ON/OFF control terminals 12a–15a of the transfer gates 12–15 (hereinafter simply referred to as control terminals) are connected to the output terminals X0–X3, respectively. When the control terminals 12a–15a are supplied with the low-level signals from the respective output terminals X0–X3, the corresponding input terminals and output terminals of the transfer gates 12–15 are mutually connected in a low-impedance state. The input terminals of the transfer gates 12–15 are supplied with operation codes $\phi_3$–$\phi_0$, respectively. Values of the operation codes $\phi_0$–$\phi_3$ are determined, depending on the type of logic expressions. The operation codes construct an n-bit code signal (a 4-bit code signal in FIG. 3). When any given one of the transfer gates 12–15 is turned ON, the corresponding one of the operation codes $\phi_0$–$\phi_3$ is outputted as a logic output Q (a logical numeral Z).

It can be seen from the above description that the decoder 11 has a function of producing an instruction signal (that is, a low-level signal) for selecting one bit of the n-bit code signal on the basis of a combination of the logic numerals X and Y. The transfer gates 12–15 have a function in which when the n-bit code signal depending on the type of the logic expression, is inputted thereto, only that one of the transfer gates 12–15 which is designated by the instruction signal passes the corresponding bit as a logic numeral Z.

A description is given of an operation of the structure of FIG. 3 with reference to FIG. 4.

The following description is with respect to a case where information which has been stored in a window region in the frame buffer 1 is designated and is then transferred to a predetermined position in a frame region (a destination region) thereof, so that the information is overwritten therein.

At the commencement of the operation, source data S and destination data D are supplied to the decoder 11 for every one bit. The decoder 11 selects one of the output terminals X0–X3 based on a combination of the source and destination data S and D. For example, when the combination "SD" is "11", the output terminal X3 is selected. Then, the input and output terminals of the transfer gate 15 are mutually connected in a low impedance state. In a case where information in the window region is overwritten in the destination region, an OR operation is carried out between the source data S and the destination data D. The host computer 2 sets the operation codes $\phi_3$–$\phi_0$ to "0111", and supplies the transfer gates 12–15 with the operation codes $\phi_3$–$\phi_0$, respectively. At this time, since the output terminal X3 of the decoder 11 has already been selected, the operation code $\phi_0$ out of the operation codes $\phi_3$–$\phi_0$, or "1" is supplied, as an operation result Q, to a frame buffer such as the frame buffer 1 of FIG. 1. In a case where the combination "SD" is "10" or "01", the operation result Q is "1". In a case where the combination is "00", the operation code $\phi_3$ is selected, and the operation result Q is "0". That is, the operation code $\phi_3$ is selected for the combination of "00", the operation code $\phi_2$ is selected for "01", the operation code $\phi_1$ is selected for "10", and the operation code $\phi_0$ is selected for "11".

In a case where the destination data D is deleted and the source data S is newly written in place thereof, the operation codes $\phi_3$–$\phi_0$ are set to "0011". As a result, the operation result Q becomes equal to the source data S, and thereby the source data S is written into the frame region.

As described above, in the present embodiment, the operation codes $\phi_0$–$\phi_3$ having values which correspond to a desired logic expression are designated and are then supplied to the transfer gates 12–15. Further, a selected one of the transfer gates 12-15 is turned ON, depending on a combination of the source data S and the destination data D, and the corresponding one of the operation codes $\phi_0$–$\phi_3$ is outputted as an operation result Q. Hence, it is not necessary to provide a logic circuit for each logical expression. As a result, the logic operation circuit can be extremely simplified, and a compact logic operation circuit can be obtained. Additionally, the same circuit structure can be used in common for all the logical expressions. Therefore, a difference in time between different types of logic expressions does not occur and, instead, can be fixed.

Figure 5:
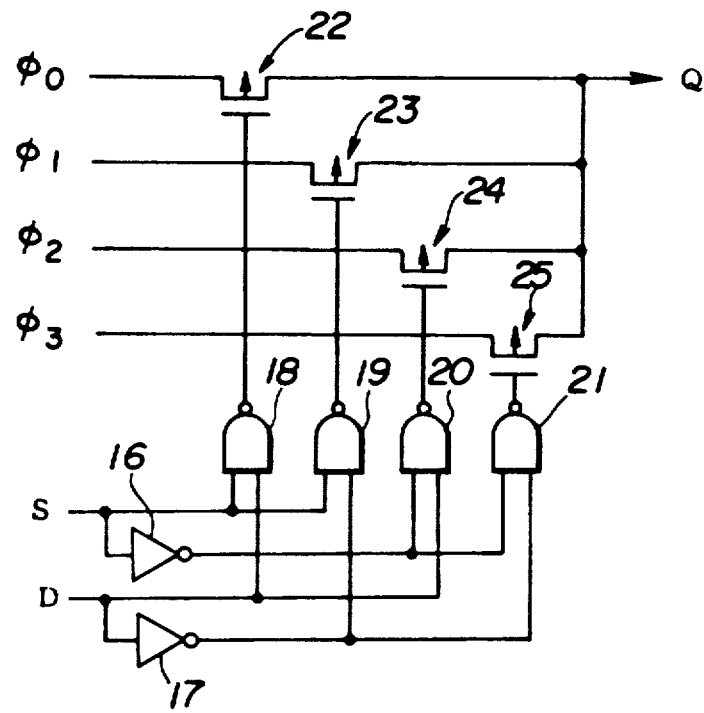
FIG. 5 is a circuit diagram of a detailed structure of the embodiment of FIG. 3.

A description is given of a detailed circuit of the structure of FIG. 3 with reference to FIG. 5. The decoder 11 is made up of two inverters 16 and 17, and four NAND gates 18-21. The transfer gates 12-15 are constituted by P-channel MOS (metal-oxide-semiconductor) transistors 22-25, respectively. The source data D is supplied directly to the NAND gates 18 and 19 and the inverter 16. An output signal of the inverter 16 is supplied to the NAND gates 20 and 21. The destination data D is supplied directly to the NAND gates 18 and 20 and the inverter 17. An output signal of the inverter 17 is supplied to the NAND gates 19 and 21. Output terminals of the NAND gates 18-21 are connected to gates of the transistors 22-25, respectively. Sources of the transistors 22-25 are supplied with the operation codes $\phi_0$–$\phi_3$, respectively. Drains of the transistors 22-25 are mutually connected. In operation, one of the outputs of the NAND gates 18-21 is switched to the low level in accordance with a combination of the source data S and the destination data D. Then the corresponding one of the transistors 22-25 is turned ON, and the corresponding one of the operation codes $\phi_0$–$\phi_3$ is selected.

Figure 6:
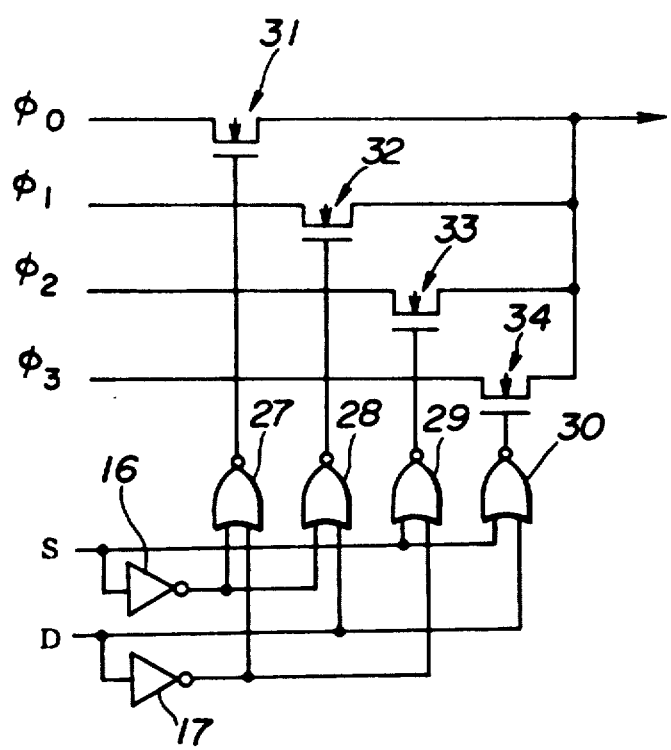
FIG. 6 is a circuit diagram of another detailed structure of the embodiment of FIG. 3.

A description is given of another detailed circuit of the structure of FIG. 3, as shown in FIG. 6. In this embodiment, NOR gates 27-30 are employed in place of the NAND gates 18-21. N-channel MOS transistors 31-34 are used in place of the P-channel MOS transistors 22-25. The source data S is supplied directly to the NOR gates 29 and 30 and the inverter 16. The output signal of the inverter 16 is supplied to the NOR gates 27 and 28. The destination data is supplied directly to the NOR gates 28 and 30 and the inverter 17. The output signal of the inverter 17 is supplied to the NOR gates 27 and 29. Drains of the transistors 31-34 are supplied with the operation codes $\phi_0$–$\phi_3$, and sources thereof are mutually connected. The structure of FIG. 6 has a function which is the same as that of the structure of FIG. 3.

Figure 7:
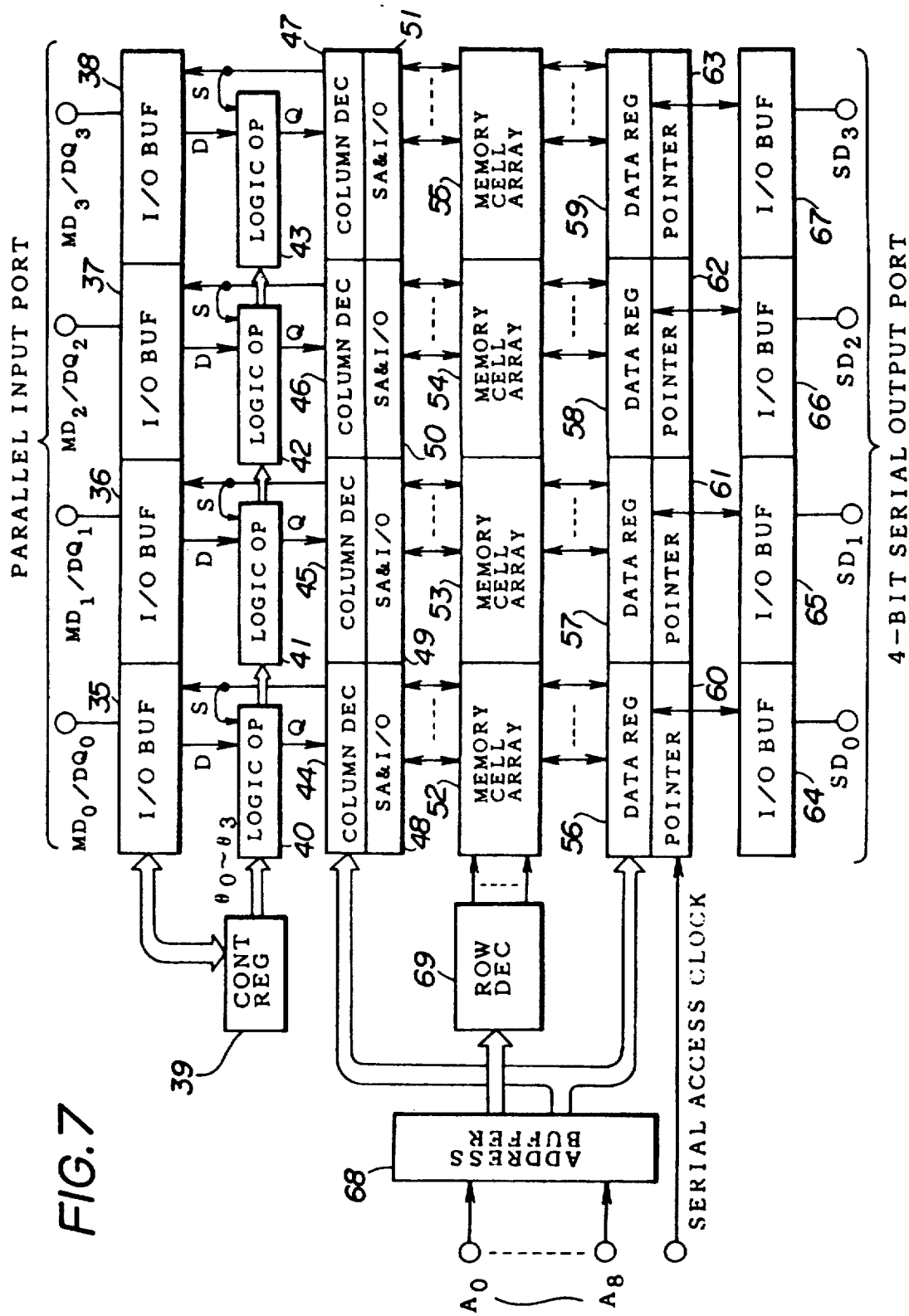
FIG. 7 is a block diagram of a semiconductor memory which employs a logic operation circuit of the present invention.

FIG. 7 shows a structure of a semiconductor memory into which the logic operation circuit of the invention is built. Input/output buffers 35-38 input and output 4-bit data MD$_0$–MD$_3$ in parallel, and input control data DQ$_0$–DQ$_3$ supplied from an external circuit such as a CPU, through a parallel input port. A control register 39 stores the control data DQ0-DQ3. Logic operation circuits 40-43 are constituted by the logic operation circuits of FIG. 3, 5 or 6. Column decoders 44-47 select pairs of bit lines included in respective memory cell arrays 52-55 in accordance with a column address (A$_0$–A$_8$) supplied from an address buffer 68. Sense amplifier-I/O gates 48-51 (hereinafter simply referred to as sense amplifiers) amplify voltage differences of selected pairs of bit lines and then read out bit information from the respective memory cell arrays 52-55. Also, the sense amplifiers 48-51 amplify write data and write the amplified write data into the memory cell arrays 52-55, respectively. Each of the memory cell arrays 52-55 includes a plurality of memory cells arranged in the form of a matrix. When a memory cell is selected by column decoders 44-47 and a row decoder 69 described later, bit information is written into the selected memory cell or is read out bit information from the selected memory cell. Data registers 56-59 are supplied, at one time, with bit information which amounts to one line in the direction of a word line of the respective memory cell arrays 52-55. Pointer registers 60-63 sequentially designate bit information which amounts to one line per one bit, in response to a serial access clock signal, whereby bit information is sequentially outputted, per one bit from each of the data registers 56-59. Serial input/output buffers 64-67 output, as serial data, the output information as thus supplied from the data registers 56-59 to the output terminals SD$_0$ to SD$_3$, respectively. The address buffer 68 produces a row address and a column address from the external address signal A$_0$–A$_8$. Then the address buffer 68 supplies the column decoders 44-47 and the row decoder 69 with the row address and column address, respectively.

In operation, the control data DQ0-DQ3 supplied from a CPU (not shown) pass through the input/output buffers 35-38, and are stored in the control register 39. On the other hand, the control data DQ0-DQ3 are supplied, as operation codes, $\phi_0$–$\phi_3$, to the logic operation circuits 40-43. The logic operation circuits 40-43 perform logic operations on the source data S and the destination data D in accordance with a logic expression determined the bit combinations of the operation codes $\phi_0$–$\phi_3$. The source data S are data read out from the memory cell arrays 52-55. The destination data D are data supplied from the input/output buffers 35-38. The operation results Q derived from the logic operation circuits 40-43 are written into the memory cell arrays 52-55 through the column decoders 44-47 and the sense amplifiers 48-51, respectively. It is noted that the logic operation circuits 40-43 can be set to a desired logic expression simply by storing the control data DQ0-DQ3 in the control register 39, and the operation results Q can be written in the memory cell arrays 52-55. It is further noted that the integration density of the memory can be increased since the same circuit structure is employed in of the logic operation circuits, and thereby the logic operation circuits can be made compact.

Figure 8:
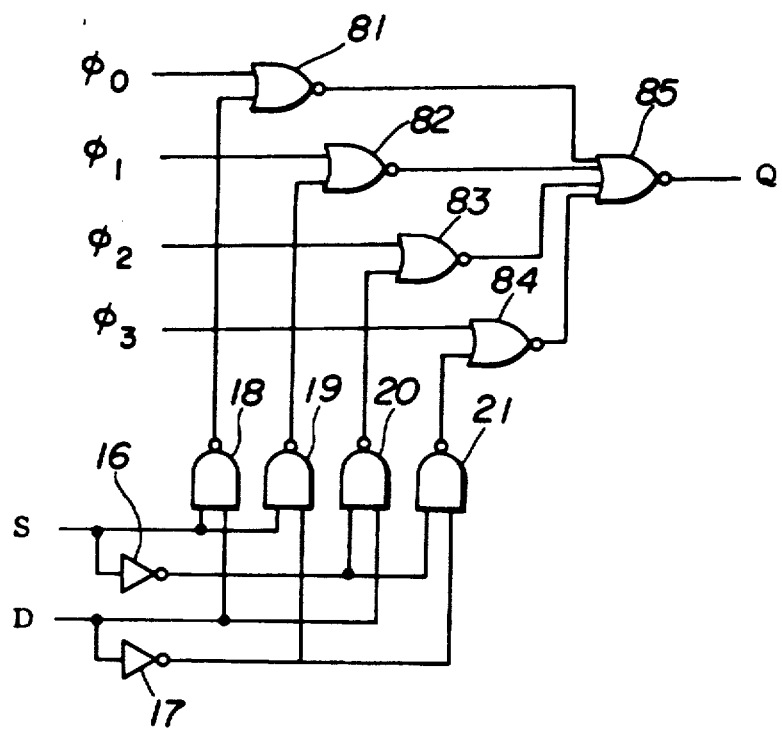
FIG. 8 is a circuit diagram of a variation of the structure of FIG. 5.

A variation of the structure of FIG. 5 is shown in FIG. 8. The structure of FIG. 8 employs NOR gates 81-84 in place of the MOS transistors 22-25, and an NOR gate 85. The structure of FIG. 8 operates in the same manner as the structure of FIG. 5. It is noted that the variation of FIG. 8 does not have a difference in operation time between different logic expressions. However, an increased number of elements are used for constructing the structure of FIG. 8, compared with the structure of FIG. 5.

Figure 9:
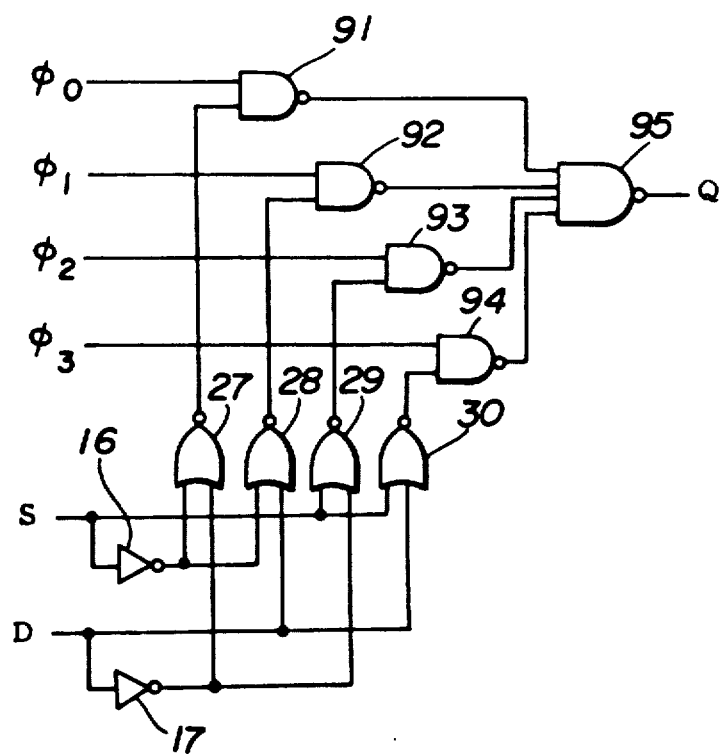
FIG. 9 is a circuit diagram of a variation of the structure of FIG. 6.

FIG. 9 shows a variation of the structure of FIG. 6. The variation of FIG. 9 employs NAND gates 91-94 in place of the MOS transistors 31-34 of FIG. 6, and a NAND gate 95. The variation of FIG. 9 operates in the same manner as the structure of FIG. 6, and does not have a difference in operation time between different logic expressions. However an increased number of elements are used for constructing the structure of FIG. 9, compared with the structure of FIG. 6.

The present invention is not limited to the embodiments, and variations and modifications may be made without departing from the scope of the present invention.

What is claimed is:

1. A logic operation circuit for performing a logic operation on first and second input logic numerals and producing a logic output numeral, said first and second logic numerals each having plural, different values and the corresponding, plural combinations of said respective, different values thereof defining corresponding, plural sets of said first and second logic numerals, said operation circuit comprising:
   means for supplying an n-bit codes signal of n-bits in parallel (where n is an integer);
   n transfer gate transistors, respectively having corresponding gates, input terminals and output terminals, said input terminals respectively receiving said n bits of said n-bit code signal and the output terminals of said transfer gate transistors being connected to common and defining a logic result output terminal of said logic operation circuit; and
   instruction signal generating means for receiving a set of said first and second input logic numerals and generating, in accordance with the respective values thereof, a corresponding set of n instruction signals, and for supplying said generating set of n instruction signals respectively to said gates of said n transfer gate transistors, said n instruction signals selectively turning the respectively associated said n transfer gate transistors ON or OFF and each said set of instruction signals turning ON a corresponding, selected one of said n transfer gate transistors, thereby connecting said input terminal thereof to said output terminal thereof and supplying the respective bit, of said n bits of said n-bit code signal, received at the input terminal thereof to said logic result output terminal as said output logic numeral of said logic operation circuit.

2. A logic operation circuit as claimed in claim 1, wherein said instruction signal generating means comprises decoder means for decoding said first and second input logic numerals and thereby generating said n instruction signals.

3. A logic operation circuit as claimed in claim 1, wherein each of said n transfer gate transistors comprises a corresponding P-channel metal-oxide-semiconductor (MOS) transistor having a source and a drain, said source and drain respectively comprising said input and output terminals of said corresponding transfer gate transistor.

4. A logic operation circuit as claimed in claim 3, wherein said instruction signal generating means comprises n NAND gates, each said NAND gate having first and second input terminals respectively supplied with said first and second input logic numerals, and an output terminal coupled to the gate of a respectively corresponding one of said transfer gate transistors.

5. A logic operation circuit as claimed in claim 3, wherein said instruction signal generating means comprises:
   n NAND gates;
   inverter means for inverting said first and second input logic numerals and outputting inverted first and second input logic numerals; and
   each of said n NAND gates has a first input terminal supplied with one numeral selected from the group consisting of said first and second input logic numerals and said inverted first and second input logic numerals, a second input terminal supplied with one numeral selected from the group consisting of said first and second input logic numerals, and an output terminal connected to the gate of a corresponding one of said n transfer gate transistors.

6. A logic operation circuit as claimed in claim 1, wherein each of said n transfer gate transistors comprises a corresponding N-channel metal-oxide-semiconductor (MOS) transistor having a source and a drain, said source and drain respectively comprising said input and output terminals of said corresponding transfer gate transistor.

7. A logic operation circuit as claimed in claim 6, wherein said instruction signal generating means comprises n NOR gates, each having input terminals supplied with said first and second input logic numerals, and an output terminal coupled to the gate of a corresponding one of said transfer gate transistors.

8. A logic operation circuit as claimed in claim 6, wherein said instruction signal generating means comprises:
   n NOR gates;
   inverter means for inverting said first and second input logic numerals and outputting inverted first and second input logic numerals; and
   each of said n NOR gates has a first input terminal supplied with one numeral selected from the group consisting of said first and second input logic numerals and said inverted first and second input logic numerals, a second input terminal supplied with one numeral selected from the group consisting of said first and second input logic numerals and said inverted first and second input logic numerals, and an output terminal connected to the gate of a corresponding one of said n transfer gate transistors.

9. A logic operation circuit as claimed in claim 1, wherein said first and second input logic numerals change at respective time intervals which are shorter than the time interval at which said n-bit code signal changes.

10. A logic operation circuit as claimed in claim 1, wherein said first input logic numeral changes at a first time interval which is different from a second time interval at which said second input logic numeral changes.

11. A logic operation circuit as claimed in claim 1, wherein the n bits of said n-bit code signal respectively change at mutually different time intervals.

12. A logic operation circuit as claimed in claim 1, wherein said first and second input logic numerals comprise image data.

* * * * *

UNITED STATES PATENT AND TRADEMARK OFFICE
CERTIFICATE OF CORRECTION

PATENT NO. : 5,130,704
DATED : July 14, 1992
INVENTOR(S) : Hiroaki OGAWA et al.

It is certified that error appears in the above-indentified patent and that said Letters Patent is hereby corrected as shown below:

Col. 1,   line 18, after "hardware" insert --processing--;
line 67, change "a" to --the--;

Col. 2,   line 35, change "structure" to --circuit--;

Col. 4,   line 34, delete "25";
line 49, change "$\phi_3$-$\phi$0" to --$\phi_3$-$\phi_0$--;
line 66, change "$\phi_0$-$\phi$3" to --$\phi_0$-$\phi_3$--.

Col. 6,   line 6, change "is read out bit information" to --bit information is read out--;
line 25, after "35-38," insert --respectively,--;
line 27, after "codes" delete ",";
line 28, after "40-43" insert --, respectively--;
line 31, after "determined" insert --depending on--;
line 45, after "in" insert --each--.

Col. 7,   line 12, change "codes" to --code--;
line 19, change "to" to --in--.

Signed and Sealed this

Nineteenth Day of April, 1994

Attest:

BRUCE LEHMAN

*Attesting Officer*      *Commissioner of Patents and Trademarks*